United States Patent
Zhou et al.

(10) Patent No.: US 9,105,777 B1
(45) Date of Patent: Aug. 11, 2015

(54) SEMICONDUCTOR GAMMA RAY DETECTOR ELEMENT CONFIGURATION OF AXIALLY SERIES MULTI-CHAMBER STRUCTURE FOR IMPROVING DETECTOR DEPLETION PLAN

(71) Applicants: Yongdong Zhou, Oak Ridge, TN (US); Xiao Zhou, Oak Ridge, TN (US); Jianhua Wan, Oak Ridge, TN (US)

(72) Inventors: Yongdong Zhou, Oak Ridge, TN (US); Xiao Zhou, Oak Ridge, TN (US); Jianhua Wan, Oak Ridge, TN (US)

( * ) Notice: Subject to any disclaimer, the term of this patent is extended or adjusted under 35 U.S.C. 154(b) by 17 days.

(21) Appl. No.: 13/999,310

(22) Filed: Feb. 10, 2014

(51) Int. Cl.
*H01L 31/18* (2006.01)
*H01L 31/0352* (2006.01)
*H01L 31/028* (2006.01)
*H01L 31/0224* (2006.01)
*H01L 31/117* (2006.01)
*H01L 31/118* (2006.01)

(52) U.S. Cl.
CPC ...... *H01L 31/035281* (2013.01); *H01L 31/028* (2013.01); *H01L 31/022408* (2013.01); *H01L 31/117* (2013.01); *H01L 31/118* (2013.01)

(58) Field of Classification Search
CPC .. H01L 37/14634–37/14636; H01L 37/14658; H01L 37/1469; H01L 31/18; H01L 31/115; H01L 31/1828; H01L 31/0296

USPC ................... 257/442, 741, E21.002, E31.016
See application file for complete search history.

(56) References Cited

U.S. PATENT DOCUMENTS

| | | | |
|---|---|---|---|
| 6,207,957 B1 * | 3/2001 | Kammeraad et al. | 250/370.1 |
| 6,236,051 B1 * | 5/2001 | Yamakawa et al. | 250/370.1 |
| 6,285,029 B1 * | 9/2001 | Shahar et al. | 250/370.14 |
| 7,223,981 B1 * | 5/2007 | Capote et al. | 250/370.13 |
| 8,575,760 B2 * | 11/2013 | Phee et al. | 257/774 |
| 2008/0203514 A1 * | 8/2008 | Szeles | 257/442 |

* cited by examiner

Primary Examiner — Michael Lebentritt (57) ABSTRACT

A High Purity Germanium (HPGe) radiation detector has been specially machined to be this invented series multi-chamber coaxial configuration. So extra-large volume HPGe detectors can be easily produced with current available HPGe crystal, and the entire detector body structure can be uniquely optimized in accordance with the exact semiconductor crystal ingot situation so the overall detector can be easier depleted and the photo-induced carriers can be better collected as the signal output. This invention makes extra-large efficiency HPGe gamma ray detectors of 100% to 200%, and maybe even higher efficiency, possible and easier to be produced based on current HPGe crystal supply capability. The invention improves the detector performance for very high energy gamma ray detection especially. The invention could also be applied to any other kind of semiconductor materials if any of them could be purified enough for this application in future.

7 Claims, 4 Drawing Sheets

SEMICONDUCTOR GAMMA RAY DETECTOR ELEMENT CONFIGURATION OF AXIALLY SERIES MULTI-CHAMBER STRUCTURE FOR IMPROVING DETECTOR DEPLETION PLAN

TECHNICAL FIELD

This invention relates to a semiconductor gamma ray detector, and more particularly at current time, to a very high efficiency High Purity Germanium (HPGe) gamma ray detector application.

BACKGROUND ART

Semiconductor crystals have been used on photon radiation detection from far infrared, infrared, visible, ultraviolet, X-ray, gamma Ray, and to even energized particle detection for decades. Different radiation detector requires different semiconductor material and special technology accordingly. In order to collect photon-induced signal carriers, space-charge-layer or electronic-field needs to be established inside semiconductor detector. This normally is achieved by fabricating either a P-N junction, P-I-N junction, or a proper surface barrier contact. Because of the extreme high penetration of high-energy gamma rays, the detector depletion-zone, or space-charge-layer of the detector, needs to be enlarged enough depending on the need of detection efficiency. The thickness of the depletion layer depends on the reverse bias voltage applied to the junction area and the doping level of the semiconductor crystal. The higher the reversed bias voltage applied, the thicker the depletion layer will be. At the same time, the lower the impurity concentration of the applied semiconductor crystal, the thicker the depletion layer is harvest. A gamma ray semiconductor detector normally is reverse biased by thousands of volts to deplete the entire crystal region. But too high bias makes the final application very difficult. So 5000V has been the maximum bias in industry practice for this application[1,2].

A common semiconductor device has a depletion layer thickness of only μm-scale, which makes the detection of high-energy gamma ray almost impossible. Because of this, impurity concentration of the applied semiconductor crystal for gamma ray detection needs to be suppressed significantly. Lithium drift technique was invented about 5 decades ago on both germanium [Ge(Li)] and silicon [Si(Li)] for the purpose of X-ray and gamma ray detection applications[3]. Lithium drift silicon detector [Si(Li)] is still being manufactured today. But, Lithium drift germanium detector needs to be kept at 80K to keep the drifted lithium from drifting away from the compensated impurity. This makes the detector hard to be used, and transported in field. So Ge(Li) detector was substituted by High Purity Germanium (HPGe) detector as soon as the HPGe crystal was achieved[4,5]. The first applied semiconductor detector structure for this application was a sandwich planar configuration of an intrinsic semiconductor detecting layer sandwiched between a $P^+$ and a $N^+$ contact layer[6]. The net residual active impurities concentration of a semiconductor crystal for gamma ray photon detecting need to be purer than $5 \times 10^{10}$ cm$^{-3}$ level, which is about $10^5$ times purer than typical unintentionally doped semiconductor crystal. Germanium, silicon, CdTe, and CdZnTe are commonly used for gamma ray detecting. But germanium is still the only semiconductor material that has been purified enough to be used as a High Purity (HP) semiconductor gamma ray detector. Even an HPGe planar detector is typically made to deplete less than 20 mm thick. A 100% or 150% relative efficiency planer gamma ray detector, efficient at 1.33 MeV, needs the applied germanium crystal to deplete over 100 mm thick. So the planar types of germanium detector are typically for X-ray and low energy gamma ray applications of very low efficiency.

Coaxial geometry HPGe detectors were invented to achieve a large active volume, (high efficiency), gamma ray detector. Over 95% of the HPGe gamma ray detectors are fabricated in standard closed-end coaxial configuration every year. There are also a few other kinds of special HPGe gamma ray detector configurations being manufactured. They are all very close to a typical planar, coaxial, or a combination of these two kinds of structures for particular applications, and are typically of very low efficiency used in X-ray or low energy gamma ray detection. Higher efficiency, typically higher than 10%, gamma ray detectors have been using the standard closed-end bulletized coaxial detector configuration for decades.

SUMMARY OF INVENTION

Technical Problem

A typical High Purity Germanium (HPGe) gamma ray detector element has a crystal diameter of two to three inches. Occasionally a detector grade HPGe crystal of close to four-inch diameter can be achieved. Even though 100% N-type, 150% P-type HPGe detectors can be purchased on the market[7,8], the delivery time of such a large volume detector can be longer than a year after the order is placed. It is very hard to make an over 100% efficiency HPGe detector for the following reasons. $1^{st}$, larger volume crystal detectors need much purer crystals since the operating bias still need to be less the 5000V. It is at the limit level of current manufacturing technology to make an over 100% efficiency HPGe detector. $2^{nd}$, after the entire crystal volume is depleted, over bias of 100V/mm is always needed for germanium, or any other semiconductor materials applied, to drive electron and hole mobility to approach a plateau (saturation mobility) of about $10^7$ cm/s[1]. So the larger volume crystal applied needs the higher over bias to effectively collect the carriers, which left the applicable bias for crystal depletion even lower. $3^{rd}$, the actual situation is even tougher, because there are always lots of carrier-trapping centers presented inside a real crystal. In reality, a real gamma ray detector needs significant over bias to overcome the trapping effect happening in depleted crystals to bring the final detector performance inside manufacturing specification. The larger the detector volume applied, the longer the carriers need to travel before they are collected, and the more chances the carriers will get trapped and not be collected within the effective time window. Even more over bias is needed for suppressing this trapping effect. What is happening in the HPGe detector industry right now for producing over 100% gamma ray detectors is: keep on trying to grow large crystals, and then make them to be large volume detectors, and then test them to see if they meet the detector performance specification. If the crystal is not good enough for this large volume detector, which often happens, the crystal will have to be ground down for smaller volume detector manufacturing. The customer will have to wait for next time to see if the crystal will be good enough for his order. For many customers, they might have to give up their plan because the manufacturers could refuse these high efficiency detector orders because of the difficulty in producing the crystal.

New technology of much better purity controlling and trapping-center free crystal growth technology needs to be developed before high efficiency, such as 200% or even higher, HPGe gamma ray detectors of useful performance can be achieved. This has been a struggle for decades, and is still open for improvement[9,10].

People are using multiple HPGe detector systems array for special needs, such as Port-monitor that is using numbers of 50% HPGe detector systems together for enough efficiency gamma ray detecting mission. But this makes the entire detecting system much more complicated. For this solution to achieve high efficiency gamma ray detection is not very desirable, because the system of multi detector elements loses a lot of signal because of Compton scattering. These entire lost signal contributes to spectra at Compton continuum in the low energy zone, which degrades the low energy gamma ray detect ability of the entire system. Multi detector elements need multi electronic systems, which make the entire system have a much higher background noise. That is why high efficiency gamma ray detector elements are always desired, even though the price is nonlinearly high.

Is there any other approach to develop a very high efficiency High-Purity semiconductor gamma ray detector based on current crystal grow technology or do we have to wait until the high quality semiconductor crystals can be developed first?

Solution to Problem

A new invention of "NEW SEMICONDUCTOR DETECTOR ELEMENT CONFIGURATION FOR VERY HIGH EFFICIENCY GAMMA-RAY DETECTION APPLICATION" of the patent number "U.S. Pat. No. 8,575,750" was recently reported to solve this problem[11]. U.S. Pat. No. 8,575,750 patent presented a great idea of using extra-large diameter HPGe crystal of special Inter-Coaxial structures, so 400% and even 1000% single HPGe detector elements of reasonable good spectrum resolutions can be achieved with just current achievable HPGe crystal quality of purity level and crystallography.

In this invention, we present a different idea of using axial series multi-chamber configuration construction that improves the whole detector depletion plan, so very large volume HPGe semiconductor crystal can be used as a single gamma ray detector element, which can be easily depleted and properly over biased. By the application of this invention, very large efficiency, such as 100%, 150%, 200%, and even 250% etc., HPGe gamma ray detectors of reasonable good spectrum resolutions can be easily manufactured with just current achievable HPGe crystal quality of purity level and crystallography.

This solution could also be applied to any other kind of semiconductor materials if any of them can be purified enough for this application in the future. The idea of this new invention of unique series multi-chamber detector element configuration is displayed in FIG. 1.

Figure 1:
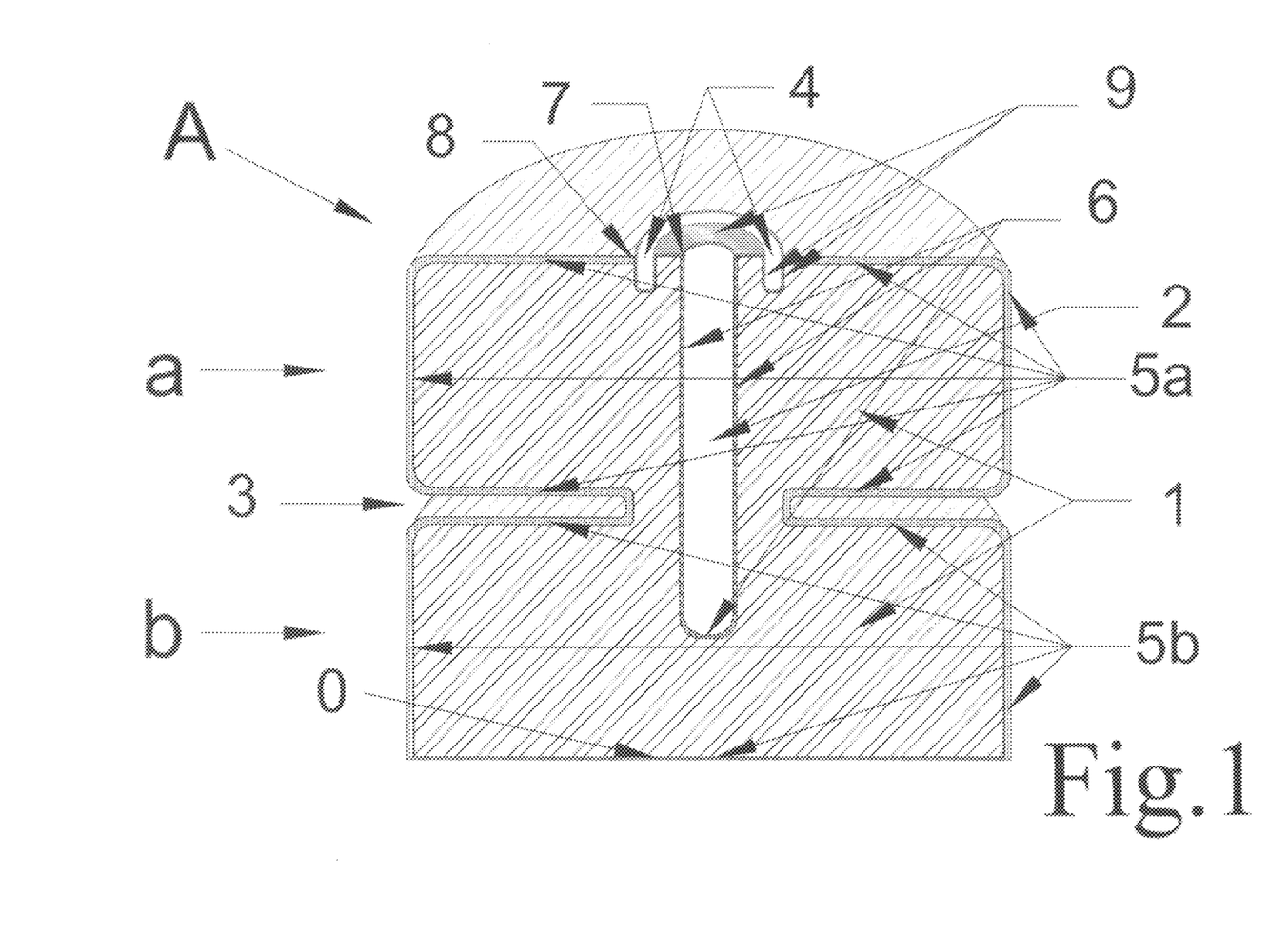

This invention solves the problem with a new series detector configuration, shown in FIG. 1. This configuration does not rely on improving crystal development. The new innovated radiation detector is comprised of a semiconductor having been machined with an additional deep radial cut 3 at about the middle from the detector cylinder surface all the way close to the detector center hole, which electrically separates the detector body to be two similar coaxial chambers series connected together in axial direction. The detector center hole surface is made to be one electrode, either an anode or a cathode, of the detector as normally be. The whole outside surface of the detector body, which is composed of the most outer part of the open end surface except a small annular area that is close to the center hole, the entire cylinder side surface, the entire new added radial cutting surface, and the entire close end surface of the detector crystal body, forms the other counter electrode of the detector, either the cathode or the anode respectively. A circular shallow groove 4 has been machined just lay outside the center hole to cut the detector surface channel helping to reduce detector surface leakage current. The entire surface of the circular shallow groove and the small center annular remaining area outside the center hole on the open end of the detector body becomes the surface passivation area that seals both the openings of inner and outer electrodes. By doing all these, the two chambers of the detector will be able to deplete from the entire outside surface to the center hole electrode independently, makes the depletion of the whole detector easier than a standard coaxial gamma ray detector configuration. The closed end electrode 0 serving as the window of the detector needs to be made very thin if the detector needs to be sensitive to very low energy gamma ray.

The nominal relative efficiency of an HPGe gamma ray detector of 30 mm thick and 85 mm in diameter crystal is about 50%. By using the invention shows in FIG. 1, a series two layers configuration detector's relative efficiency will become 100%.

Figure 2:
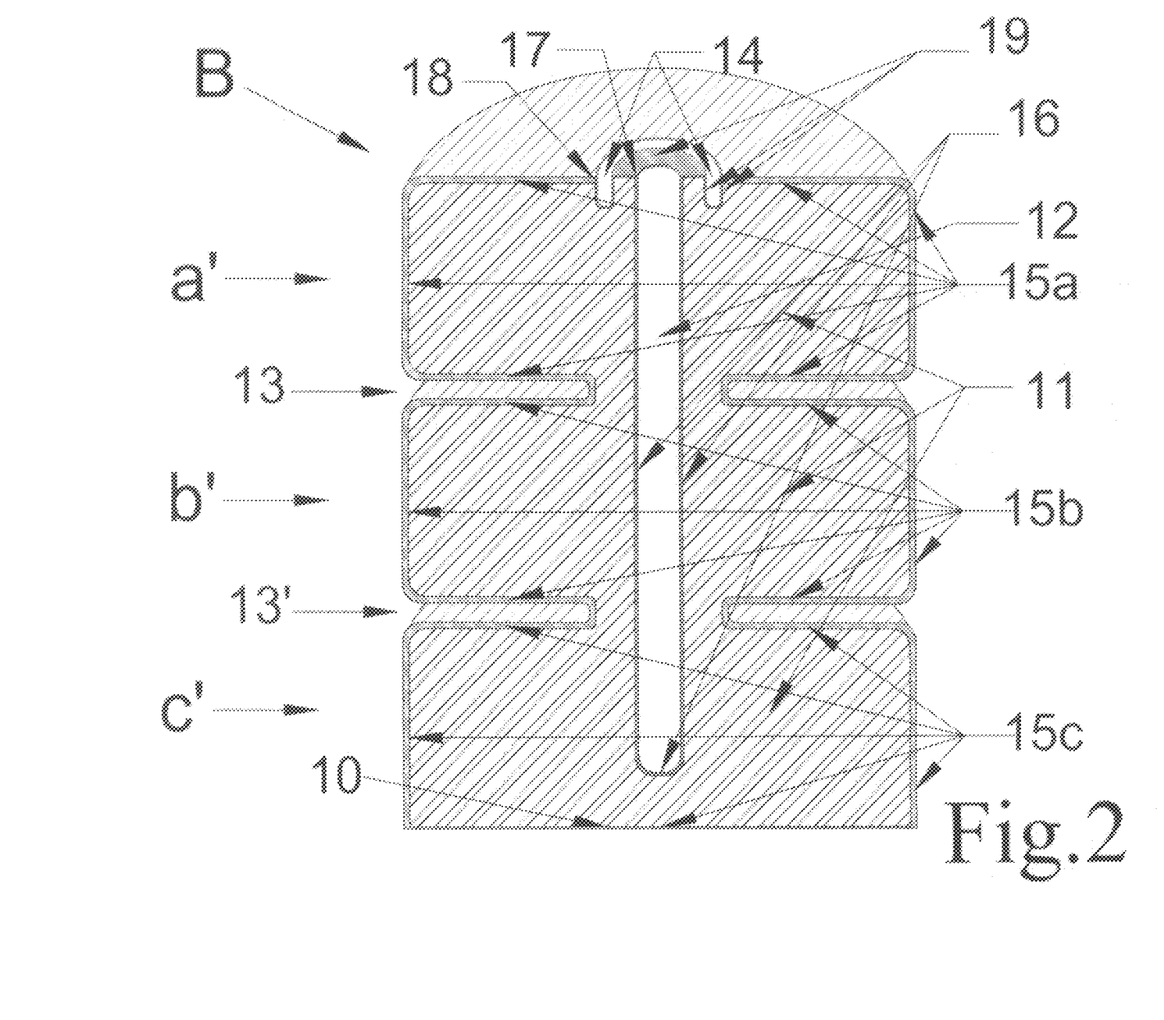

FIG. 2. show a series three layers multi-chamber HPGe detector construction of this innovation. The new innovated radiation detector now is comprised of a semiconductor having been machined with an additional deep radial two-cuts 13/13' from the detector cylinder surface all the way close to the detector center hole, which electrically separates the detector body to be three similar coaxial chambers series connected together in axial direction. The detector center hole surface is made to be one electrode, either an anode or a cathode, of the detector as normally be. The whole outside surface of the detector body, which is composed of the most outer part of the open end surface except a small annular area that is close to the center hole, the entire outside cylinder surface, the entire new added radial two-cutting surface, and the entire close end surface of the detector crystal body, forms the other counter electrode of the detector, either the cathode or the anode respectively. A circular shallow groove 14 has been machined just lay outside the center hole to cut the detector surface channel helping to reduce detector surface leakage current. The entire surface of the circular shallow groove and the small center annular remaining area outside the center hole on the open end of the detector body becomes the surface passivation area that seals both the openings of inner and outer electrodes. By doing all these, the three chambers of the detector will be able to deplete from the entire outside surface to the center hole electrode independently, makes the depletion of the whole detector crystal easier than a standard coaxial gamma ray detector configuration. The closed end electrode 10 serving as the window of the detector needs to be made very thin if the detector needs to be sensitive to very low energy gamma ray.

The nominal relative efficiency of an HPGe gamma ray detector of 30 mm thick and 85 mm in diameter crystal is about 50%. By using the invention shows in FIG. 2, a series three layers configuration detector's relative efficiency will be close to 150%.

Figure 3:
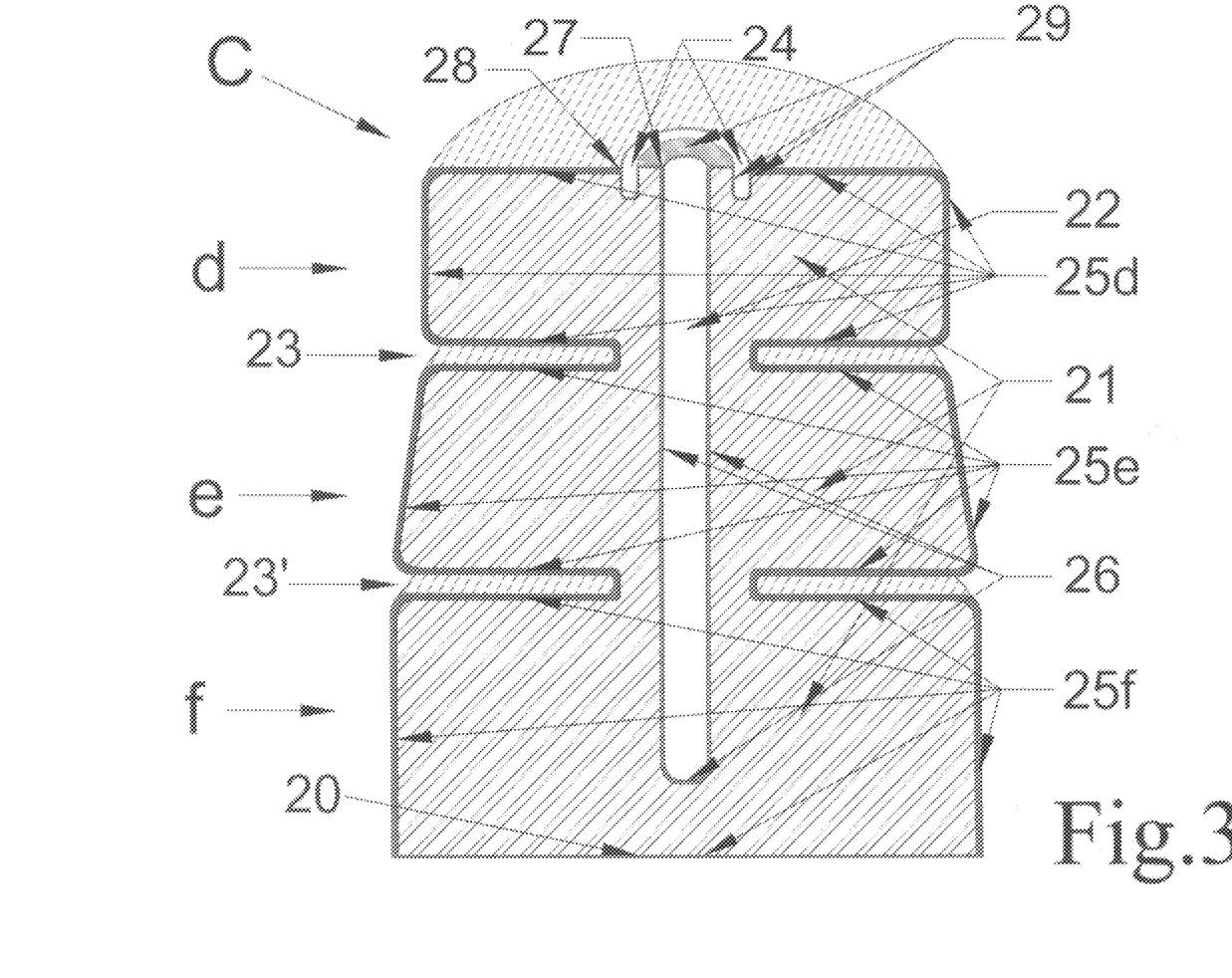

FIG. 3 shows another example of a 3-layer series multi-chamber HPGe gamma ray detector element structure. The three chambers of this detector in FIG. 3 are intended designed to be different in both the chamber thickness and diameter to maximum the usage of a semiconductor crystal ingot. The semiconductor crystal quality of f chamber that is to the closed-end side of the detector is better than that of d chamber that is to the open-end of the detector. So f chamber of better crystal is now designed to be larger than the d chamber that of poorer crystal quality. The cylinder side of e chamber is even slightly tapered towards the open end side that of poorer crystal quality so the entire crystal of the detector will be able to depleted and properly over biased at the same reversed bias voltage. Scientist and engineer can design each detector structure according to the exact crystal ingot situation so every crystal ingot can be used more efficiently.

Figure 4:
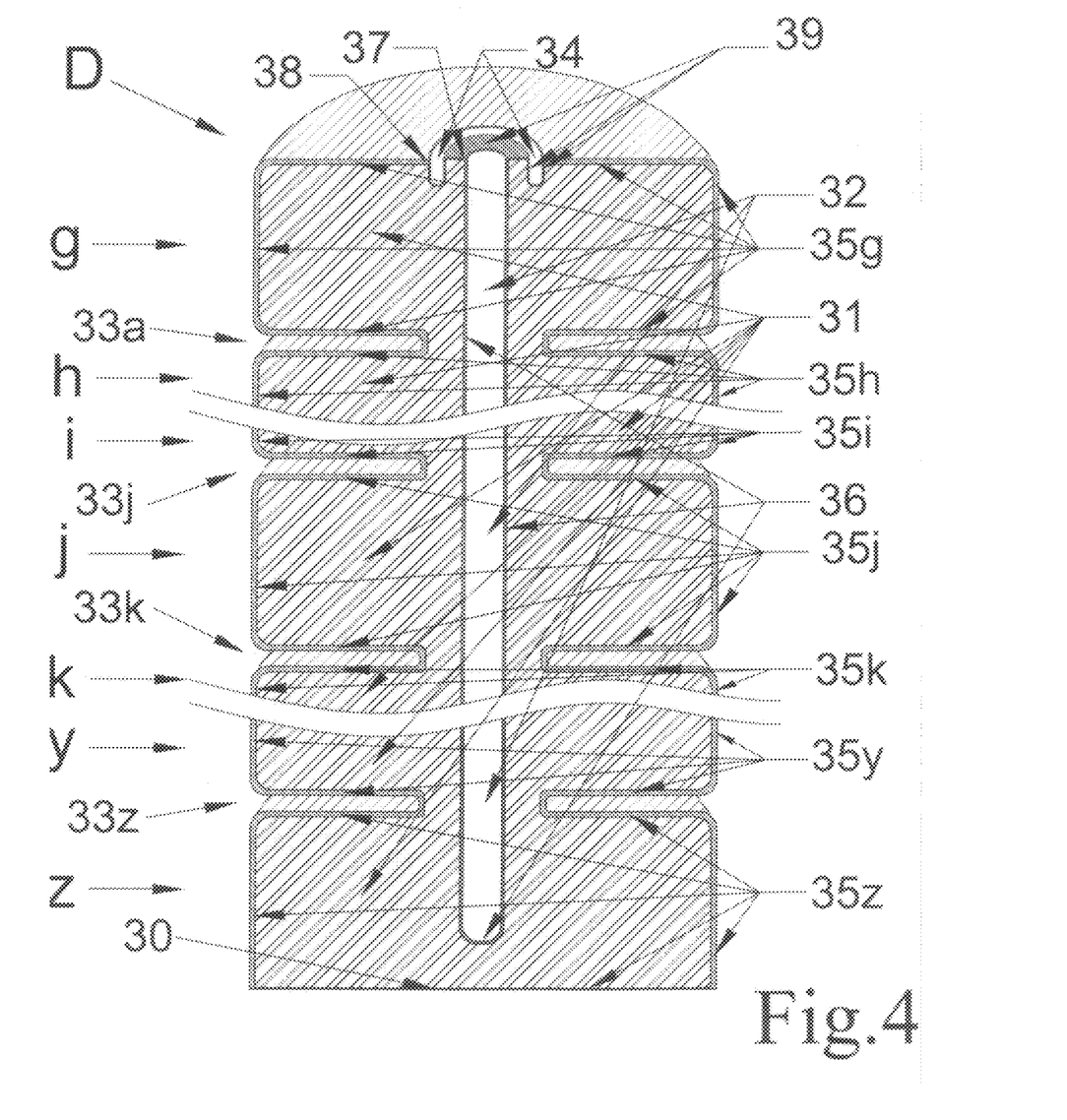

More radial cuts can be added if more chambers are needed to be designed for extra-large efficiency gamma ray detectors and any other special application reason. FIG. 4 shows a concept example of an (n+1)-layer series multi-chamber of n cuts construction HPGe gamma ray detector element structure. By using the invention shows in FIG. 4, a detector of even larger relative efficiency of about 200%, and even 250$ etc. will be able to produced.

Advantageous Effects of this Invention

This invention of new axially series multi-chamber detector element configuration improved the overall detector crystal depletion plan, more electrical independent gamma ray detecting crystal chambers can be added to the entire detector construction, and each chambers is depleted independently under reasonable reversed bias, so larger volume semiconductor crystal can be involved to produce single detector element of very large efficiency.

Since each chamber is depleted independently, the detector chamber dimensions can be specially designed in accordance with every crystal ingot situation. The semiconductor crystal ingot can be used more efficiently for gamma ray detector manufacturing.

INDUSTRIAL APPLICABILITY

Thematically there is no special new technology needed to introduce this new invention of Series Multi-Chamber coaxial detector configuration into current HPGe manufacturing industry to achieve the application of this very useful extra-large efficiency semiconductor gamma ray detector. The current crystal machining technique, P$^+$ contact layer of ion implantation technique, N$^+$ contact layer of lithium diffusion technique, surface passivation technique, and even loading and packing techniques, etc., could be adopted to this new type of detector fabrication. Basically it should be able to make this new invention to manufacturing products quickly based on current well-developed HPGe gamma ray detector technology.

REFERENCES (1). IEEE Standard Test Procedures for Germanium Gamma-Ray Detectors, IEEE Std 325-1996, Published by the Institute of Electrical and Electronics Engineers, Inc., 345 East 47$^{th}$ Street, New York, N.Y. 10017, USA. 29 May, 1997.
(2). IEEE Standard Test Procedures for Semiconductor X-Ray Energy Spectrometers, IEEE Std 759-1984, Published by the Institute of Electrical and Electronics Engineers, Inc., 345 East 47$^{th}$ Street, New York, N.Y. 10017, USA. Dec. 15, 1984.
(3). Freck D V, Wakefield J. Nature 1962:193:669.
(4). Materials Science in Semiconductor Processing. Vol. 9, Num. 4-5, August/October 2006
(5). E. E. Haller, Germanium: From its Discovery to SiGe devices, Materials Science in Semiconductor Processing. Vol. 9, 2006, 408-422
(6). Glenn F. Knoll, Radiation Detection and Measurement, 3$^{rd}$ edition. John Wiley & Sons, Inc. 1999
(7). ORTEC Products Group at AMETEK, since 1960, 801 South Illinois Avenue, Oak Ridge, Tenn., 37831-0895, USA. http://www.ortec-online.com/solutions/index.aspx.
(8). Canberra Industries Inc. at AREVA, for 40 years, 800 Research Parkway, Meriden, Conn., 06450, USA. http://www.canberra.com/products.
(9). Ben Depuydt, Antoon Theuwis, Igor Romandic, Materials Science in Semiconductor Processing. Vol. 9, 2006, 437-443.
(10). Umicore Electro-optic Materials. Watertorenstraat 33, 2250 Olen, Belgium. http://eom.unicore.com/en/materials/products/germaniumForGammaRayDetectors/.
(11). Yongdong Zhou, Xiao Zhou. "NEW SEMICONDUCTOR DETECTOR ELEMENT CONFIGURATION FOR VERY HIGH EFFICIENCY GAMMA-RAY DETECTION APPLICATION", USA patent U.S. Pat. No. 8,575,750, Nov. 5, 2013.

BRIEF DESCRIPTION OF THE DRAWING

A better understanding of this invention can be gained from a consideration of the following detailed description of the preferred embodiments thereof, in conjunction with the appended drawing, wherein:

FIG. 1 is an example of a high purity germanium gamma ray detector element structure of this invented new 2-layer series multi-chamber gamma ray detector element for improving detector depletion plan, so double volume crystal can be achieved of the same depletion situation. In this example an radial cut 3 was made at about the middle from the cylinder side all the way close to the center hole that electrically separate the detector body to be two similar chambers, making the new final semiconductor crystal body to comprise of two similar coaxial structures series axially connected together. The outer side contact (5a and 5b) of the crystal, which is shown in cyan if the Figure is printed in color, is heavy doped P-type germanium crystal layer, and the inner side contact (6) of the crystal, which is shown in magenta if the Figure is printed in color, is heavily doped N-type germanium layer. The contact sides can be switched, in which either side contact can be N$^+$ if the other side contact is P$^+$. A shallow circular coaxial groove 4 has been machined to cut the detector surface channel helping to reduce detector surface leakage. The entire surface of the circular shallow groove and the small remaining annular center area, which is shown in green if the Figure is printed in color, becomes the surface passivation area 9 of the detector that need to be carefully passivated to seal both the openings of detector's electrode contacts.

FIG. 2 is an example of a high purity germanium gamma ray detector element structure of this invented new 3-layer series multi-chamber gamma ray detector element for improving detector depletion plan, so triple volume crystal can be achieved of the same depletion situation. In this example two radial cuts 13 and 13' were made from the cylinder side all the way close to the center hole that electrically separate the detector body to be three similar chambers, making the new final semiconductor crystal body to comprise of three similar coaxial structures series axially connected together. The outer side contact of the detector, which is shown in cyan if the Figure is printed in color, is heavy doped P-type germanium crystal layer, and the inner side contact of the detector, which is shown in magenta if the Figure is printed in color, is heavily doped N-type germanium layer. The contact sides can be switched, in which either side contact can be N$^+$ if the other side contact is P$^+$. An optional shallow circular coaxial groove has been machined to cut the detector surface channel helping to reduce detector surface leakage. The entire surface of the circular shallow groove and the small remaining annular center area, which is shown in green if the Figure is printed in color, becomes the surface passivation area of the detector that need to be carefully passivated so as to seal both the openings of detector's N+ and P+ contacts.

FIG. 3 is also an example of a high purity germanium gamma ray detector element structure of this invented new 3-layer series multi-chamber gamma ray detector element. The three chambers of this detector in FIG. 3 are diverse of both the thickness and diameter. The crystal to the closed end side of the detector may be better than to the open end side so the f chamber, to the closed end of the detector, is now designed to be larger than the d chamber, to the open end of the detector. The cylinder side of e chamber is even slightly tapered towards the open end side so the entire crystal of the detector will be able to depleted and properly over biased at the same reversed bias voltage. Scientist and engineer can design each detector structure according to the exact crystal ingot situation so every crystal ingot can be used more efficiently.

FIG. 4 is a concept example of a high purity germanium gamma ray detector element structure of this invented new series multi-chamber gamma ray detector element. In this example n radial cuts were made from the cylinder side all the way close to the center hole that electrically separate the detector body to be (n+1) similar chambers, making the new final semiconductor crystal body to comprise of (n+1) similar coaxial structures series axially connected together. The outer side contact of the detector, which is shown in cyan if the Figure is printed in color, is heavy doped P-type germanium crystal layer, and the inner side contact of the detector, which is shown in magenta if the Figure is printed in color, is heavily doped N-type germanium layer. The contact sides can be switched, in which either side contact can be N+ if the other side contact is P+. An optional shallow circular coaxial groove has been machined to cut the detector surface channel helping reduce detector surface leakage. The entire surface of the circular shallow groove and the small remaining annular center area, which is shown in green if the Figure is printed in color, becomes the surface passivation area of the detector that need to be carefully passivated so as to seal both the openings of detector's N+ and P+ contacts.

DESCRIPTION OF THE PREFERRED EMBODIMENTS

FIG. 1 shows a semiconductor gamma ray detector A in accordance with this invention. This radiation detector is comprised of a cylinder sized semiconductor 1 of High Purity Germanium crystal having been machined a deep hole 2 at the center of one end (open end) all the way close to the other end (closed end). A cut 3 was made at about the middle from the cylinder side all the way close to the center hole 2 that electrically separate the detector body to be two chambers of a and b, making the new final semiconductor crystal body to comprise of two coaxial structures series axially connected together. In this new invented detector structure, the entire center hole surface 6 becomes an electrode of the new detector A (either an anode or a cathode). The whole outside surface 5a and 5b of both the detector chamber a and b respectively, which is composed of the most outer part of the open end surface except small annular area that is close to the center hole, the whole cylinder side surface, the entire cutting surface of 3, and the close end surface that also serves as the detector window of the detector crystal body, forms the other counter electrode of the detector A (either the cathode or the anode respectively). A small circular shallow groove 4 has been coaxially machined from the open end of the detector crystal just lay outside the center hole to cut the detector surface channel helping reduce detector surface leakage current. Now the inner electrode is open at the center edge of the open end 7 and the outside electrode is open at the out edge of the shallow groove 8. The entire surface of the small shallow circular groove and the small center annular remaining area of the open end becomes the surface area 9 of the detector that needed to be carefully passivated and seals the open ends 7 and 8 of both the inner and outer electrodes. By doing all these, both the detector chamber a and b will be able to deplete from the entire outside surface 5a and 5b respectively to the center electrode 6, makes the depletion easier than a standard coaxial gamma ray detector configuration. The electrode area of the closed end 0, that is serving as the window of the detector, needs to be made very thin if the detector needs to function at very low energy gamma ray spectrum side. The passivation layer 9 can be either a deposition layer of proper dielectric material thin film, e.g. $SiO_2$, or simply the native oxidized layer of the semiconductor material of the crystal surface. The electrode layers of 5a, 5b, and 6 can be either a deposition layers of proper metal materials, e.g. gold, palladium, etc, for a right arrangement of correct surface barriers, or simply the thin native semiconductor surface layers that been converted to be either P+ layer for cathode or N+ layer for anode using the techniques of ion implantation or diffusion etc.

FIG. 2 shows another semiconductor gamma ray detector B in accordance with this invention. This radiation detector is comprised of a cylinder sized semiconductor 11 of High Purity Germanium crystal having been machined a deep hole 12 at the center of one end (open end) all the way close to the other end (closed end). Two deep cut 13 and 13' were made at about the trisection from the cylinder side all the way close to the center hole 12 that electrically separate the detector body to be three chambers of a', b', and c', making the new final semiconductor crystal body to comprise of three coaxial structures series axially connected together. In this new invented detector structure, the entire center hole surface 16 becomes an electrode of the new detector B (either an anode or a cathode). The whole outside surface 15a, 15b, and 5c of the detector chamber a', b', and c' respectively, which is composed of the most outer part of the open end surface except small annular area that is close to the center hole, the whole cylinder side surface, both the entire cutting surface of 13 and 13', and the close end surface that also serves as the detector window of the detector crystal body, forms the other counter electrode of the detector B (either the cathode or the anode respectively). A small circular shallow groove 14 has been coaxially machined from the open end of the detector crystal just lay outside the center hole to cut the detector surface channel helping reduce detector surface leakage current. Now the inner electrode is open at the center edge of the open end 17 and the outside electrode is open at the out edge of the circular shallow groove 18. The entire surface of the small shallow circular groove and the small center annular remaining area of the open end becomes the surface area 19 of the detector that needed to be carefully passivated. By doing all these, all three detector chamber a', b', and c' will be able to deplete from the entire outside surface 15a, 15b, and 15c respectively to the center electrode 16, makes the depletion easier than a standard coaxial gamma ray detector configuration. The electrode area of the closed end 10 that is serving as the window of the detector need to be made to be very thin if the detector needs to function at very low energy gamma ray spectrum side. The passivation layer 19 can be either a deposition layer of proper dielectric material thin film, e.g. SiO₂, or simply the native oxidized layer of the semiconductor material. The electrode layers of 15a, 15b, 15c and 16 can be either a deposition layers of proper metal materials, e.g. gold, palladium, etc, for a right arrangement of correct surface barriers, or simply the thin native semiconductor surface layers that been converted to be either P⁺ layer for cathode or N⁺ layer for anode using the techniques of ion implantation or diffusion etc.

FIG. 3 shows another three-chamber series configuration semiconductor gamma ray detector C in accordance with this invention. The thickness and diameter of the three chambers of this detector C are diverse that is different from detector B shown in FIG. 2, giving engineer an opportunity to optimize each detector structure in accordance with the semiconductor crystal overall property. The cylinder body shape of the middle chamber e of the detector C was even slightly tapered. This radiation detector is comprised of a cylinder sized semiconductor 21 of High Purity Germanium crystal having been machined a deep hole 22 at the center of one end (open end) all the way close to the other end (closed end). Two deep cut 23 and 23' were made from the cylinder side all the way close to the center hole 22 that electrically separate the detector body to be three chambers of d, e, and f, making the new final semiconductor crystal body to comprise of three different sized coaxial structures series axially connected together. In this new invented detector structure, the entire center hole surface 26 becomes an electrode of the new detector C (either an anode or a cathode). The whole outside surface 25d, 25e, and 25f of the detector chamber d, e, and f respectively, which is composed of the most outer part of the open end surface except small annular area that is close to the center hole, the whole cylinder side surface, both the entire cutting surface of 23 and 23', and the close end surface of the detector crystal body, forms the other counter electrode of the detector C (either the cathode or the anode respectively). A small circular shallow groove 24 has been coaxially machined from the open end of the detector crystal just lay outside the center hole to cut the detector surface channel helping reduce detector surface leakage current. Now the inner electrode is open at the center edge of the open end 27 and the outside electrode is open at the out edge of the circular shallow groove 28. The entire surface of the small shallow circular groove and the small remaining center annular area of the open end becomes the surface area 29 of the detector that needed to be carefully passivated and seals the open ends 27 and 28 of both the inner and outer electrodes. By doing all these, all three detector chamber d, e, and f will be able to deplete from the entire outside surface 25d, 25e, and 25f respectively to the center electrode 26, makes the depletion of the entire detector easier than a standard coaxial gamma ray detector configuration. The electrode area of the closed end 20 that is serving also as the window of the detector need to be made to be very thin if the final detector needs to function at very low energy gamma ray spectrum side. The passivation layer 29 can be either a deposition layer of proper dielectric material thin film, e.g. SiO₂, or simply the native oxidized layer of the semiconductor material. The electrode layers of 25d, 25e, 25f and 26 can be either a deposition layers of proper metal materials, e.g. gold, palladium, etc, for a right arrangement of correct surface barriers, or simply the thin native semiconductor surface layers that been converted to be either P⁺ layer for cathode or N⁺ layer for anode using the techniques of ion implantation or diffusion etc.

FIG. 4 shows a concept semiconductor gamma ray detector D in accordance with this invention. This radiation detector is comprised of a cylinder sized semiconductor 31 of High Purity Germanium crystal having been machined a deep hole 32 at the center of one end (open end) all the way close to the other end (closed end). N deep cut 33a, . . . , 33j, 33k, . . . , 33y, and 13z were made from the cylinder side all the way close to the center hole 32 that electrically separate the detector body to be (n+1) chambers of g, h, . . . , i, j, k, . . . , y and z, making the new final semiconductor crystal body to comprise of (n+1) coaxial structures series axially connected together. In this new invented detector structure, the entire center hole surface 36 becomes an electrode of the new detector D (either an anode or a cathode). The whole outside surface 35g, 35h, . . . , 35i, 35j, 35k, . . . , 35y and 35z of the detector chamber g, h, . . . , i, j, k, . . . , y and z respectively, which is composed of the most outer part of the open end surface except small annular area that is close to the center hole, the whole cylinder side surface, both the entire cutting surface of 33g, 35h, . . . , 33j, 33k, . . . , 33y, and 13z, and the close end surface that also serves as the detector window of the detector crystal body, forms the other counter electrode of the detector D (either the cathode or the anode respectively). A small circular shallow groove 34 has been coaxially machined from the open end of the detector crystal just lay outside the center hole to cut the detector surface channel helping reduce detector surface leakage current. Now the inner electrode is open at the center edge of the open end 37 and the outside electrode is open at the out edge of the circular shallow groove 38. The entire surface of the small shallow circular groove and the small remaining center annular area of the open end becomes the surface area 39 of the detector that needed to be carefully passivated that seals both the openings 37 and 38 of the inner and outer electrodes. By doing all these, all (n+1) detector chamber g, h, . . . , i, j, k, . . . y and z will be able to deplete from the entire outside surface 35g, 35h, . . . , 35i, 35j, 35k, . . . , 35y and 35z respectively to the center electrode 36, makes the depletion easier than a standard coaxial gamma ray detector configuration. The electrode area of the closed end 30 that is serving as the window of the detector need to be made to be very thin if the detector needs to function at very low energy gamma ray spectrum side. The passivation layer 39 can be either a deposition layer of proper dielectric material thin film, e.g. SiO₂, or simply the native oxidized layer of the semiconductor material. The electrode layers of 35g, 35h, . . . , 35i, 35j, 35k, . . . , 35y and 35z and 36 can be either a deposition layers of proper metal materials, e.g. gold, palladium, etc, for a right arrangement of correct surface barriers, or simply the thin native semiconductor surface layers that been converted to be either P⁺ layer for cathode or N⁺ layer for anode using the techniques of ion implantation or diffusion etc.

The invention claimed is:

1. A semiconductor Gamma Ray detector comprising:
   a cylindrical semiconductor body of crystal construction having two ends at one end a center hole is formed that extends from said one end of said cylindrical semiconductor body and stops just prior to the other end of said cylindrical semiconductor body;
   a one radial cut construction is formed in said cylindrical semiconductor body and extends from the outer cylinder surface of said cylindrical semiconductor body and stops just prior to said center hole of said cylindrical semiconductor body, electrically separates said cylindrical semiconductor body to be two chambers;
   a first electrode formed on the inner surface of said center hole of said cylindrical semiconductor body;

a second electrode formed on the whole out surface of said cylindrical semiconductor body that is composed of the entire surface of said the other end of said cylindrical semiconductor body, the entire surface of said the outer cylinder surface of said semiconductor body, the entire surface of said radial cut construction, and the surface of the most outer area of said one end of said semiconductor body except the small area that lies outside the opening of said center hole on said one end of said cylindrical semiconductor body;

and a passivation layer formed on said the small area that lies outside the opening of said center hole on said one end of said cylindrical semiconductor body that seals both the openings of said first electrode and second electrode;

wherein said cylindrical semiconductor body forms two axial layers of a coaxial nature construction series connected together that are electrically depleted independently under reversed bias.

2. A semiconductor Gamma Ray detector comprising:

a cylindrical semiconductor body of crystal construction having two ends at one end a center hole is formed that extends from said one end of said cylindrical semiconductor body and stops just prior to the other end of said cylindrical semiconductor body;

a two radial cuts construction is formed in said cylindrical semiconductor and extends from the outer cylinder surface of said cylindrical semiconductor body and stops just prior to said center hole of said cylindrical semiconductor body, electrically separates said cylindrical semiconductor body to be three chambers;

a first electrode formed on the inner surface of said center hole of said cylindrical semiconductor body;

a second electrode formed on the whole out surface of said cylindrical semiconductor body that is composed of the entire surface of said the other end of said cylindrical semiconductor body, the entire surface of said the outer cylinder surface of said cylindrical semiconductor body, the entire surface of said two radial cuts construction, and the surface of the most outer area of said one end of said cylindrical semiconductor body except the small area that lies outside the opening of said center hole on said one end of said cylindrical semiconductor body;

and a passivation layer formed on said the small area that lies outside the opening of said center hole on said one end of said cylindrical semiconductor body that seals both the openings of said first electrode and second electrode;

wherein said cylindrical semiconductor body forms three axial layers of a coaxial nature construction series connected together that are electrically depleted independently under reversed bias.

3. A semiconductor Gamma Ray detector comprising:

a cylindrical semiconductor body of crystal construction having two ends at one end a center hole is formed that extends from said one end of said cylindrical semiconductor body and stops just prior to the other end of said cylindrical semiconductor body;

a n (n=3, 4, 5, 6, . . . ) radial cuts construction is formed in said cylindrical semiconductor and extends from the outer cylinder surface of said cylindrical semiconductor body and stops just prior to said center hole of said cylindrical semiconductor body, electrically separates said cylindrical semiconductor body to be n+1 (n=3, 4, 5, 6, . . . ) chambers;

a first electrode formed on the inner surface of said center hole of said cylindrical semiconductor body;

a second electrode formed on the whole outer surface of said cylindrical semiconductor body that is composed of the entire surface of said the other end of said cylindrical semiconductor body, the entire surface of said the outer cylinder surface of said cylindrical semiconductor body, the entire surface of said n (n=3, 4, 5, 6, . . . ) radial cuts construction, and the surface of the most outer area of said one end of said cylindrical semiconductor body except the small area that lies outside the opening of said center hole on said one end of said cylindrical semiconductor body;

and a passivation layer formed on said the small area that lies outside the opening of said center hole on said one end of said semiconductor body that seals both the openings of said first electrode and second electrode;

wherein said cylindrical semiconductor body forms n+1 (n=3, 4, 5, 6, . . . ) axial layers of a coaxial nature construction series connected together that are electrically depleted independently under reversed bias.

4. A semiconductor Gamma Ray detector of claims 1 to 3 further comprising an anode $N^+$ contact of the first or the second electrode and a cathode $P^+$ contact of other of the first or the second electrode.

5. A semiconductor Gamma Ray detector of claims 1 to 3, wherein one or both of the first and second electrodes form a Schottky contact such that reverse leakage current is inhibited and the photo-generated signal current being effectively collected owning to the rectification effect.

6. A semiconductor Gamma Ray detector of claims 1 to 3, wherein an anode $N^+$ contact or a cathode $P^+$ contact of one of the first or second electrode is formed and the other of the first or second electrodes a Schottky contact is formed, so the rectification effect is achieved.

7. A semiconductor Gamma Ray detector of claim 4, wherein the semiconductor material is High Purity Germanium and the $P^+$ contact comprises implanted Boron and the $N^+$ contact comprises diffused Lithium.

* * * * *